United States Patent
Sanghani et al.

[11] Patent Number: 5,923,835
[45] Date of Patent: Jul. 13, 1999

[54] METHOD FOR SCAN TEST OF SRAM FOR MICROPROCESSORS HAVING FULL SCAN CAPABILITY

[75] Inventors: Amit D. Sanghani, Santa Clara; Narayanan Sridhar, Sunnyvale, both of Calif.

[73] Assignee: Sun Microsystems, Inc., Palo Alto, Calif.

[21] Appl. No.: 08/880,468

[22] Filed: Jun. 23, 1997

[51] Int. Cl.$^6$ .............................. G06F 11/00; G11C 29/00
[52] U.S. Cl. ............................ 395/183.06; 395/183.18; 395/800.36; 371/21.1; 371/21.3
[58] Field of Search .................... 371/21.1, 22.1, 371/22.31, 22.36, 21.3; 395/180, 182.03, 183.06, 800.38, 183.18; 327/291

[56] References Cited

U.S. PATENT DOCUMENTS

| | | | |
|---|---|---|---|
| 5,412,662 | 5/1995 | Honma et al. | 371/21.1 |
| 5,459,733 | 10/1995 | Alapat | 371/21.1 |
| 5,499,249 | 3/1996 | Agrawal et al. | 371/25.1 |
| 5,604,756 | 2/1997 | Kawata | 371/67.1 |
| 5,696,770 | 12/1997 | Lo | 371/21.1 |
| 5,761,489 | 6/1998 | Broseghini et al. | 395/568 |

*Primary Examiner*—Meng-Ai T. An
*Assistant Examiner*—Joseph Paul Schweiss
*Attorney, Agent, or Firm*—Sierra Patent Group, Ltd

[57] ABSTRACT

A method for allowing a RAM array within an SRAM to be tested via scan ATPG is disclosed. A first clocked flip-flop has a data input latched high, a scan-in input latched high, a clock input coupled to a signal source generating a periodic waveform, a scan-enable input coupled to a scan enable signal, and an output. The first flip-flop inverts the data input at the output when the scan enable signal is low, and places the scan-in input signal at the output when the scan enable signal is high. A second clocked flip-flop has a data input coupled to the output of the first flip-flop, a scan-in input latched high, a clock input coupled to the signal source, a scan enable input coupled to the scan enable signal, and an output. The second flip-flop inverts the data input at the output when the scan enable signal is low, and places the scan-in input signal at the output when the scan enable signal is high. An AND gate has a first input coupled to an inversion of the scan enable signal, a second input coupled to the output of the second flip-flop, and an output coupled to a write enable input to the SRAM.

2 Claims, 3 Drawing Sheets

METHOD FOR SCAN TEST OF SRAM FOR MICROPROCESSORS HAVING FULL SCAN CAPABILITY

RELATED APPLICATION DATA

This application is related to U.S. patent application Ser. No. 08/880,930 filed on even date herewith pending, commonly assigned herewith, having the same inventors and entitled "APPARATUS FOR SCAN TEST OF SRAM FOR MICROPROCESSORS HAVING FULL SCAN CAPABILITY."

BACKGROUND OF THE INVENTION

1. Field of the Invention

The present invention relates to a method for testing embedded memory arrays within a microprocessor. More particularly, the invention relates to a method for testing negative edge SRAM arrays not having dedicated test circuitry via scan ATPG and other memory test algorithms.

2. The Prior Art

Large RAM arrays embedded in microprocessors are typically tested via a dedicated test mode with dedicated pins. However, small RAM arrays do not include dedicated test mode capability, since such a capability would increase die size and performance overhead. Therefore, small RAM arrays and large RAM arrays must be tested separately.

Testing of microprocessor chips is typically performed sequentially in three separate stages. Typically, embedded large memory arrays are tested during a first stage. Next, during a second stage, the portion of the microprocessor chip excluding the memory arrays is tested via scan Automatic Test Pattern Generation (ATPG). The small memory arrays are normally disabled during the scan mode to avoid corruption of the RAM. Therefore, the embedded small memory arrays must be tested during a separate third stage. A need exists in the prior art for an apparatus for testing the small memory arrays during scan ATPG. Similarly, a need exists in the prior art for an apparatus for testing memory arrays that do not include dedicated test circuitry during scan ATPG. Moreover, it would be preferable to implement such a means while minimizing die size and performance overhead.

BRIEF DESCRIPTION OF THE INVENTION

A first clocked flip-flop has a first flip-flop data input latched high, a first flip-flop scan-in input latched high, a clock input coupled to an externally controlled signal source generating a periodic waveform, a scan-enable input coupled to a scan enable signal, and a first flip-flop output. The first flip-flop inverts the first flip-flop data input at the first flip-flop output when the scan enable signal is low, and places the first flip-flop scan-in input signal at the first flip-flop output when the scan enable signal is high. In addition, a second clocked flip-flop has a second flip-flop data input coupled to the first flip-flop output, a second flip-flop scan-in input latched high, a clock input coupled to the signal source, a scan enable input coupled to the scan enable signal, and a second flip-flop output. The second flip-flop inverts the second flip-flop data input at the second flip-flop output when the scan enable signal is low, and places the second flip-flop scan-in input signal at the second flip-flop output when the scan enable signal is high. An AND gate has a first input coupled to an inversion of the scan enable signal, a second input coupled to the second flip-flop output, and an output coupled to a write enable signal enabling the SRAM.

The present invention allows testing of memory arrays via scan ATPG, decreasing the total time required to test each microprocessor chip. The invention is applicable to RAMs which are read or written at the negative edge of the clock. Furthermore, address lines, data lines, control lines, and output lines must be scannable. The RAM is enabled by a write-enable signal.

The chip starts out in the functional mode of operation. After shifting appropriate values for the control signals, address and data lines during the test mode, a read or write is performed in the normal mode, depending upon the control signals, address and data lines. The test mode is then used to shift out the outputs. During the test mode, the write enable signal is deasserted to disable unwanted writes to the array, and the scan-enable signal is asserted. During the normal mode, while the scan-enable signal is deasserted, the write enable signal is normally asserted. A valid write will occur after the last shift clock when the address, data and control lines are set up. However, when the clock signal is asserted during the normal mode to capture the data, an unwanted write will occur during this capture mode, causing corruption of the RAM. The present invention alleviates this problem by forcing the write enable signal low during the capture mode.

DETAILED DESCRIPTION OF THE PREFERRED EMBODIMENTS

Those of ordinary skill in the art will realize that the following description of the present invention is illustrative only and not in any way limiting. Other embodiments of the invention will readily suggest themselves to such skilled persons.

The present invention ensures that the write enable signal is deasserted during the capture mode of the scan ATPG. This avoids the undesirable write resulting in corruption of the RAM, allowing memory arrays to be tested via scan ATPG and other memory test algorithms.

Specifically, the presently preferred embodiment of the present invention is designed for use with a negative edge SRAM. Since the SRAM is read or written at the negative edge of the clock, address, data and control lines will be set at the positive edge of the clock. However, one of ordinary skill in the art will recognize that with inversion of the clock signal, the present invention may be used with a positive edge SRAM. Furthermore, since the invention is for use with the scan ATPG, address lines, data lines, control lines, and output lines must be scannable. Therefore, read/write of RAM is done at the negative edge of the clock, and values for address, data and control lines will be set at the positive edge of the clock. A write enable signal enables the RAM.

Figure 1:
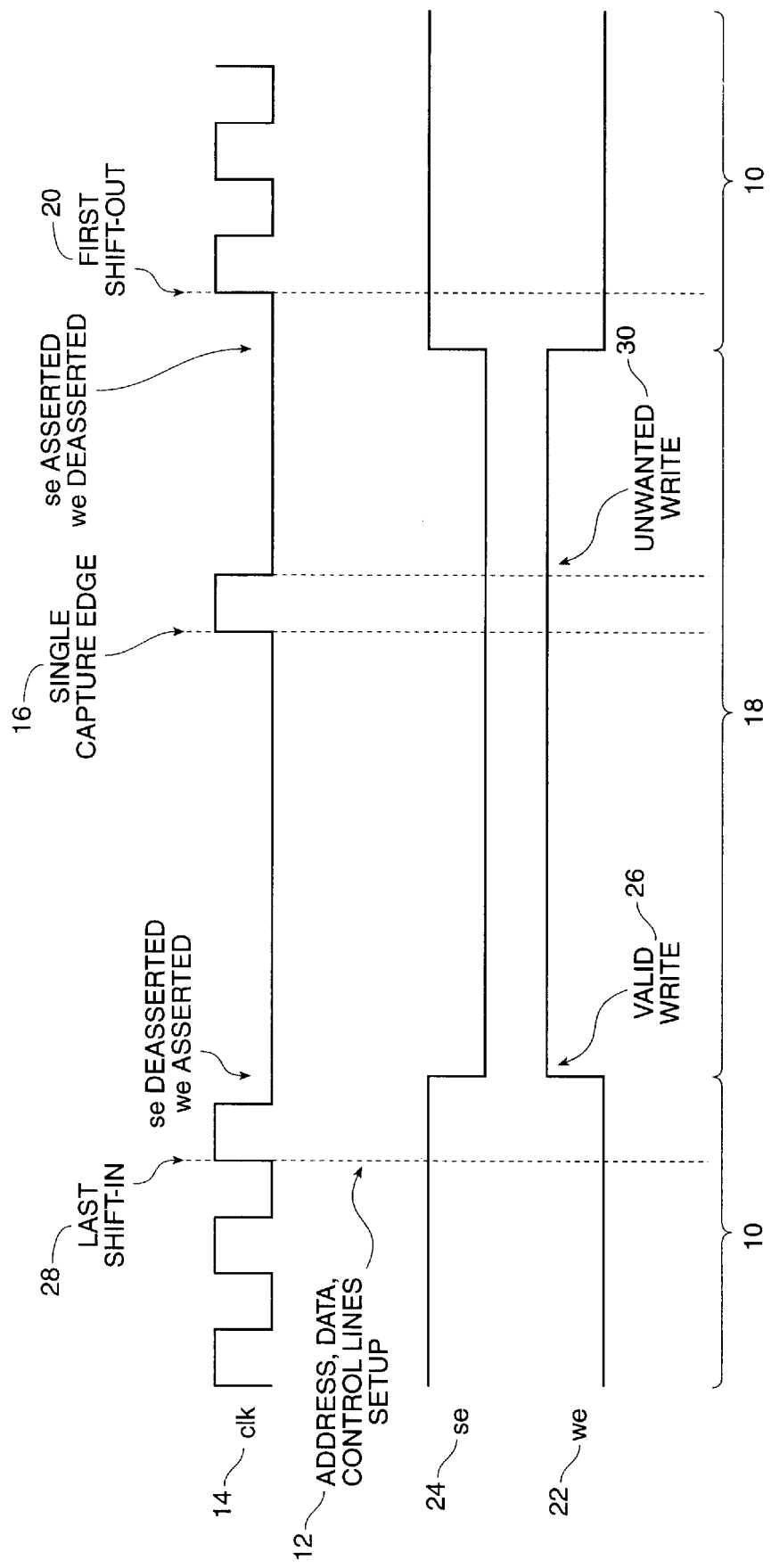
FIG. 1 illustrates waveforms resulting when a RAM array is written during scan ATPG according to the prior art.

Referring first to FIG. 1, waveforms resulting when a RAM array is written during scan ATPG according to the prior art are shown. The chip starts out in the functional mode of operation, not shown. During test mode 10, appropriate values for the control signals, address and data lines are shifted 12 into the RAM at the positive edge of a clock 14. Next, a read or write, or capture edge 16, is performed in normal mode 18, depending upon the control signals, address and data lines. The test mode 10 is then used to shift out 20 the outputs. During the test mode 10, write enable signal 22 is deasserted to disable unwanted writes to the array, and scan-enable signal 24 is asserted. During the normal mode 18, while the scan-enable signal 24 is deasserted to disable the scan circuitry on the RAM chip, the write enable signal 22 is normally asserted. A valid write 26 will occur after last shift clock 28 when the address, data and control lines are set up. However, when the clock signal 14 is asserted during the normal mode 18 to capture the data, an unwanted write 30 will occur during this capture mode, causing corruption of the RAM. The present invention alleviates this problem by forcing the write enable signal 22 low during the capture mode.

Figure 2:
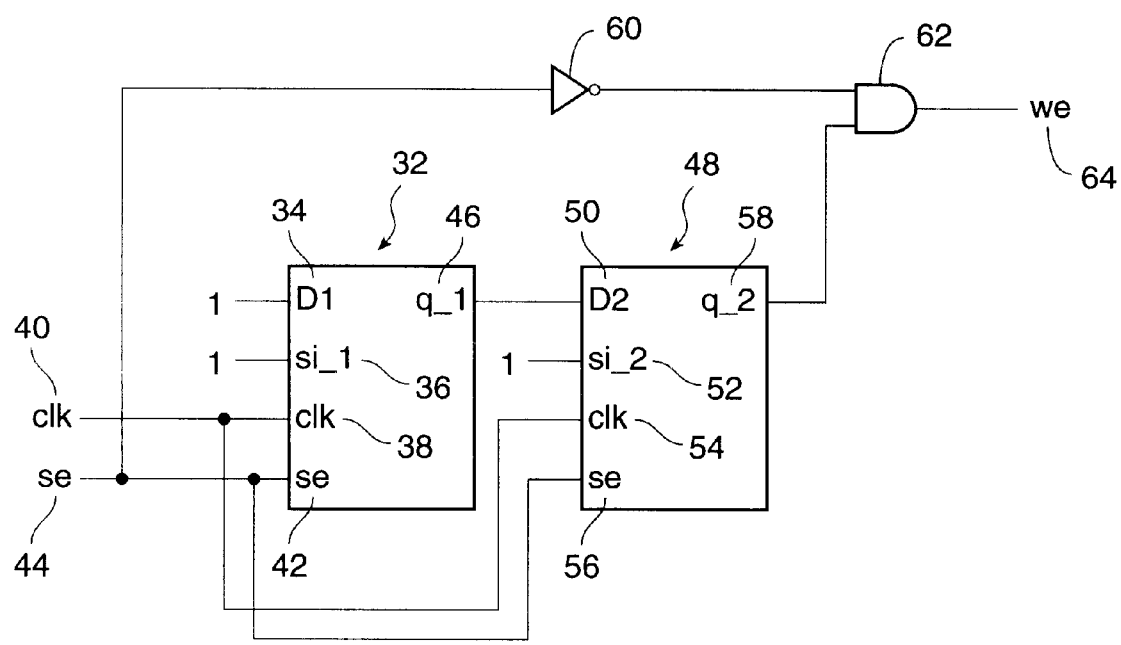
FIG. 2 illustrates a circuit diagram of a presently preferred embodiment of the present invention.

Referring now to FIG. 2, a circuit diagram of the presently preferred embodiment of the present invention is shown. The presently preferred embodiment of the present invention comprises two synchronously clocked flip-flops. A first clocked flip-flop 32 has a first flip-flop data input 34, a first flip-flop scan in input 36, a first flip-flop clock input 38 coupled to an externally controlled periodic waveform generator 40, a first flip-flop select line, or first flip-flop scan enable input 42, coupled to a scan enable signal 44, and a first flip-flop output 46. The first flip-flop data input 34 is latched high. Similarly, the first flip-flop scan in input 36 is latched high. When the scan enable signal 44 is high, the first flip-flop 32 places the first flip-flop scan-in input signal 36 at the first flip-flop output 46. However, when the scan enable signal 44 is low, the first flip-flop 32 inverts the first flip-flop data input 34 at the first flip-flop output 46.

A second clocked flip-flop 48 has a second flip-flop data input 50 coupled to the first flip-flop output 46, a second flip-flop scan in input 52, a second flip-flop clock input 54 coupled to the externally controlled periodic waveform generator 40, a second flip-flop select line, or second flip-flop scan enable input 56, coupled to the scan enable signal 44, and a second flip-flop output 58. The second flip-flop scan in input 52 is latched high. When the scan enable signal 44 is high, the second flip-flop 48 places the second flip-flop scan-in input signal 52 at the second flip-flop output 58. However, when the scan enable signal 44 is low, the second flip-flop 48 inverts the second flip-flop data input 50 at the second flip-flop output 58. According to a presently preferred embodiment of the present invention, a modified flip-flop is used for the first flip-flop 32 and the second-flip flop 48. The modified flip-flop is a scannable flip-flop, which acts as a D flip-flop in normal mode, and operates as a scan flop in test mode. However, one of ordinary skill in the art will recognize that alternative circuit elements may be used to achieve the same result.

The scan enable signal 44 is inverted by an inverter 60. An AND gate 62 having a first input coupled to the output of the inverter 60 and a second input coupled to the second flip-flop output 58 has an output coupled to a write enable input 64 to the RAM. Although the circuit is designed for use with a negative edge SRAM, inclusion of an inverter to invert the signal to the clock inputs 38, 54 will allow the present invention to be used with a positive edge SRAM.

TABLE 1

|  | SE' | D1 | SI_1 | Q_1 | D2 | SI_2 | Q_2 | WE |
|---|---|---|---|---|---|---|---|---|
| Functional mode | 1 | 1 | 1 | 0 | 0 | 1 | 1 | 1 |
| Test/Shift/scan-in mode | 0 | 1 | 1 | 1 | 1 | 1 | 1 | 0 |

TABLE 1-continued

|  | SE' | D1 | SI_1 | Q_1 | D2 | SI_2 | Q_2 | WE |
|---|---|---|---|---|---|---|---|---|
| Region between shift & capture modes | 1 | 1 | 1 | 1 | 1 | 1 | 1 | 1 |
| Capture mode | 1 | 1 | 1 | 0 | 0 | 1 | 0 | 0 |

The function of the present invention during all operational modes is shown above in TABLE 1. In the functional mode, the scan-enable signal SE 44 is deasserted. During this state, the first flip-flop 32 inverts the first flip-flop data input D1 34 at the first flip-flop output Q_1 46. The first flip-flop output Q_1 46 is coupled to the second flip-flop data input D2 50. Since the scan-enable signal SE 44 is low, the second flip-flop 48 inverts the second flip-flop data input D2 50 at the second flip-flop output Q_2 58. Therefore, as indicated above, the write enable signal WE 64 is high.

During the test mode, the write enable signal 64 is deasserted to disable unwanted writes to the array. In addition, the scan-enable signal 44 is asserted. During this state, the first flip-flop 32 passes the first flip-flop scan in input SI_1 36 through to the first flip-flop output Q_1 46. The first flip-flop output Q_1 46 is coupled to the second flip-flop input D2 50. Since the scan-enable signal SE 44 is asserted, the second flip-flop 48 passes the second flip-flop scan in input SI_2 52 through to the second flip-flop output Q_2 58. Therefore, in the test mode, the write enable signal WE 64 is low.

In the region between the end of the test mode and the beginning of the capture mode, the scan-enable signal 44 is deasserted. Since there are no clock cycles during this mode, the flip-flops 32, 48 maintain their previous state. Therefore, in this region, the write enable signal WE 64 is high.

In the capture mode, the scan-enable signal 44 remains deasserted. During this state, the first flip-flop 32 inverts the first flip-flop data input D1 34 at the first flip-flop output Q_1 46. The first flip-flop output Q_1 46 is coupled to the second flip-flop data input D2 50. Since the scan-enable signal SE 44 is low, the second flip-flop 48 inverts the second flip-flop data input D2 50 at the second flip-flop output Q_2 58. However, since a clock signal is asserted, the value of the second flip-flop data input D2 50 inverted at the second flip-flop output Q_2 58 is the value obtained during the previous time region. Therefore, the write enable signal WE 64 is forced low during the capture mode to avoid corruption of the RAM.

Figure 3:
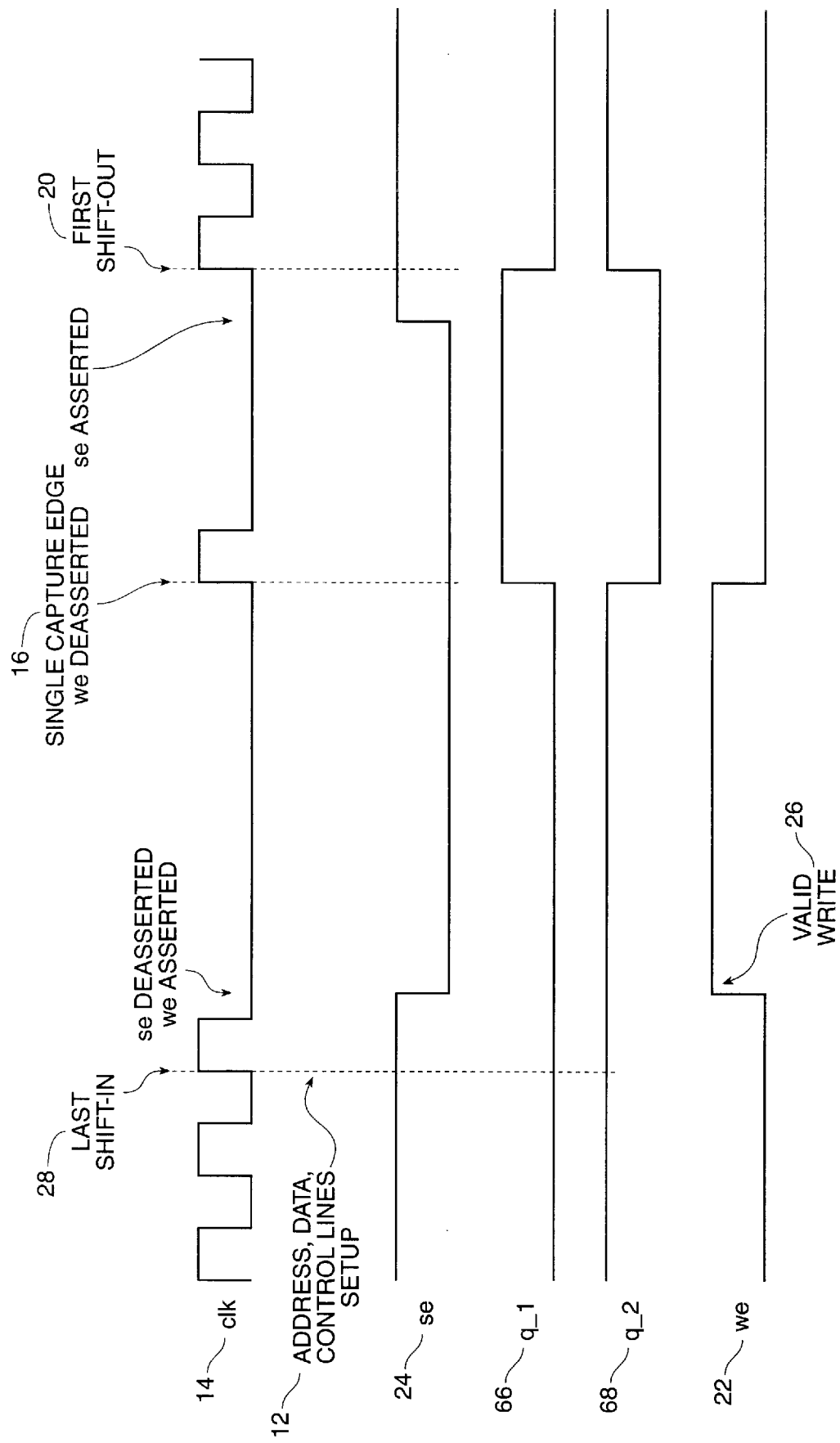
FIG. 3 illustrates waveforms resulting when a RAM array is written during scan ATPG according to a presently preferred embodiment of the present invention.

Referring now to FIG. 3, waveforms resulting when a RAM array is written during scan ATPG according to a presently preferred embodiment of the present invention are presented. Output waveforms for the first flip-flop 66 and the second flip-flop 68 are illustrated. Through deassertion of the write enable signal 22 during the capture mode 16, the unwanted write to the RAM is disabled.

The present invention provides a method for testing memory arrays during scan ATPG. This invention is particularly useful in testing memory arrays which do not include dedicated test circuitry. Accordingly, the present invention decreases the time required to test a microprocessor chip. This results in a substantial decrease in production cost per microprocessor chip.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a microprocessor having an SRAM, the SRAM having scannable data lines, address lines, control lines and outputs, a first clocked flip-flop having a first flip-flop data input latched high, a first flip-flop scan-in input latched high, a clock input coupled to an externally controlled signal source generating a periodic waveform, a scan-enable input coupled to a scan enable signal, and a first flip-flop output, the first flip-flop inverting the first flip-flop data input at the first flip-flop output when the scan enable signal is low, and placing the first flip-flop scan-in input signal at the first flip-flop output when the scan enable signal is high, a second clocked flip-flop having a second flip-flop data input coupled to the first flip-flop output, a second flip-flop scan-in input latched high, a clock input coupled to the signal source, a scan enable input coupled to the scan enable signal, and a second flip-flop output, the second flip-flop inverting the second flip-flop data input at the second flip-flop output when the scan enable signal is low, and placing the second flip-flop scan-in input signal at the second flip-flop output when the scan enable signal is high, and an AND gate having a first input coupled to an inversion of the scan enable signal, a second input coupled to the second flip-flop output, and an output coupled to a write enable signal enabling the SRAM, a method for allowing a RAM array to be tested, the method comprising the following steps:

scanning the address lines, the control lines, and data from the data lines into the RAM array when the scan-enable signal is high and the write-enable signal is low in response to a clock transition in a first direction, the step of scanning further including the steps of clocking the first flip-flop and clocking the second flip-flop;

writing the data in the RAM array when the scan-enable signal is low and the write-enable signal is high in response to a clock transition in a second direction opposite to that of the first direction;

forcing the write-enable signal low when the scan-enable signal is low in response to a clock transition in the first direction;

storing the data in the RAM array when the scan-enable signal is low in response to a clock transition in the second direction, the step of storing further including the steps of
clocking the first flip-flop, and
clocking the second flip-flop; and scanning the data out of the RAM array when the scan-enable signal is high and the write-enable signal is low in response to a clock transition in the first direction, the step of scanning data out of the RAM array further including the steps of clocking the first flip-flop and clocking the second flip-flop.

2. In a microprocessor having an SRAM, a method for allowing a RAM array to be tested, the SRAM having scannable data lines, address lines, control lines and outputs, the method comprising:

providing a first clocked flip-flop having a first flip-flop data input latched high, a first flip-flop scan-in input latched high, a clock input coupled to an externally controlled signal source generating a periodic waveform, a scan-enable input coupled to a scan enable signal, and a first flip-flop output, the first flip-flop inverting the first flip-flop data input at the first flip-flop output when the scan enable signal is low, and placing the first flip-flop scan-in input signal at the first flip-flop output when the scan enable signal is high;

providing a second clocked flip-flop having a second flip-flop data input coupled to the first flip-flop output, a second flip-flop scan-in input latched high, a clock input coupled to the signal source, a scan enable input coupled to the scan enable signal, and a second flip-flop output, the second flip-flop inverting the second flip-flop data input at the second flip-flop output when the scan enable signal is low, and placing the second flip-flop scan-in input signal at the second flip-flop output when the scan enable signal is high;

providing an AND gate having a first input coupled to an inversion of the scan enable signal, a second input coupled to the second flip-flop output, and an output coupled to a write enable signal enabling the SRAM;

scanning the address lines, the control lines, and data from the data lines into the RAM array when the scan-enable signal is high and the write-enable signal is low in response to a clock transition in a first direction, the step of scanning further including the steps of clocking the first flip-flop and clocking the second flip-flop;

writing the data in the RAM array when the scan-enable signal is low and the write-enable signal is high in response to a clock transition in a second direction opposite to that of the first direction;

forcing the write-enable signal low when the scan-enable signal is low in response to a clock transition in the first direction;

storing the data in the RAM array when the scan-enable signal is low in response to a clock transition in the second direction, the step of storing further including the steps of
clocking the first flip-flop, and
clocking the second flip-flop; and scanning the data out of the RAM array when the scan-enable signal is high and the write-enable signal is low in response to a clock transition in the first direction, the step of scanning data out of the RAM array further including the steps of clocking the first flip-flop and clocking the second flip-flop.

* * * * *